(12) United States Patent
Yamano (10) Patent No.: US 7,459,343 B2
(45) Date of Patent: Dec. 2, 2008

(54) METHOD OF MANUFACTURING SEMICONDUCTOR DEVICE AND SUPPORT STRUCTURE FOR SEMICONDUCTOR SUBSTRATE

(75) Inventor: Takaharu Yamano, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 11/336,217

(22) Filed: Jan. 20, 2006

(65) Prior Publication Data

US 2006/0128063 A1 Jun. 15, 2006

Related U.S. Application Data

(62) Division of application No. 11/132,063, filed on May 18, 2005, now abandoned.

(30) Foreign Application Priority Data

May 28, 2004 (JP) .............................. 2004-159871

(51) Int. Cl.
*H01L 21/00* (2006.01)
*H01L 21/46* (2006.01)
(52) U.S. Cl. ..................... 438/114; 438/458; 438/459
(58) Field of Classification Search .................. 438/114
See application file for complete search history.

(56) References Cited

U.S. PATENT DOCUMENTS

| 6,444,310 B1 * | 9/2002 | Senoo et al. ................. 428/354 |
| 6,492,195 B2 | 12/2002 | Nakanishi et al. |
| 6,908,784 B1 * | 6/2005 | Farnworth et al. .......... 438/106 |

FOREIGN PATENT DOCUMENTS

| JP | 04-336448 | 11/1992 |
| JP | 2002 231854 | 8/2002 |
| JP | 2002 270720 | 9/2002 |
| JP | 2003-324142 | 11/2003 |

OTHER PUBLICATIONS

Notification of the First Office Action dated Jan. 4, 2008 for the corresponding CN200510071370.5.

* cited by examiner

*Primary Examiner*—Lex Malsawma
(74) *Attorney, Agent, or Firm*—Ladas & Parry LLP (57) ABSTRACT

A method of manufacturing a semiconductor device is disclosed. The method comprises a first step of grinding a second principle surface of a semiconductor substrate opposite to a first principle surface of the semiconductor substrate on which semiconductor device elements are formed, a second step of attaching a support structure configured to support the semiconductor substrate to the second principle surface after the first step, and a third step of detaching the semiconductor substrate from the support structure.

4 Claims, 7 Drawing Sheets

METHOD OF MANUFACTURING SEMICONDUCTOR DEVICE AND SUPPORT STRUCTURE FOR SEMICONDUCTOR SUBSTRATE

BACKGROUND OF THE INVENTION

1. Field of the Invention

The present invention relates to a method of manufacturing a semiconductor device and a support structure for a semiconductor substrate used for the method.

2. Description of the Related Art

With growing demands for smaller and higher performance semiconductor devices in recent years, packaging of semiconductors is required to have smaller size and provide for higher performance.

For example, there has been a demand for reducing thickness of semiconductor devices. To meet this demand, it is necessary to reduce the thickness of packaged semiconductor substrates by increasing a grinding amount in a so-called backgrinding process, where a back face of a semiconductor substrate or a face opposite to a face on which semiconductor device elements are formed is ground to reduce the thickness of the semiconductor substrate.

Figure 1:
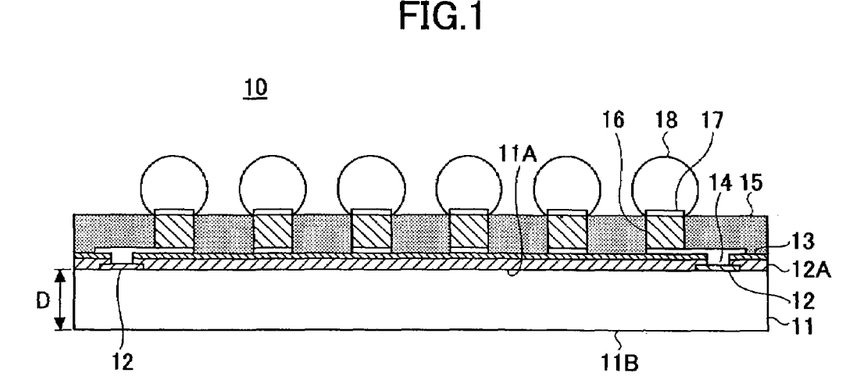
FIG. 1 is a schematic cross-sectional view of a semiconductor device having a CSP structure.

FIG. 1 is a schematic illustration of a semiconductor device 10 having a CSP (Chip Size Package) structure, which is an example of a structure that allows size reduction of semiconductor devices.

Referring to FIG. 1, the semiconductor device 10 comprises a semiconductor substrate 11, which may be a Si wafer or the like, having a device face 11A on which semiconductor device elements are formed and a back face 11B opposite to the device face 11A. Plural electrode pads 12 made of Al or the like are formed on the device face 11A. A passivation layer 12A made of SiN or the like is formed to cover the device face 11A except where the electrode pads 12 are formed. The passivation layer 12A is covered by a passivation layer 13 made of resin such as polyimide. Further, the passivation layer 13 is covered by a sealing resin layer 15.

Wiring sections 14 made of Cu are formed in openings in the passivation layer 12A and the passivation layer 13 to be connected to the electrode pads 12. The wiring sections 14 are patterned to extend partly onto the passivation layer 13.

Wiring posts 16 are formed upright on the wiring sections 14 formed on the passivation layer 13 to be connected to the wiring sections 14. A side surface of each of the wiring posts 16 is surrounded by the sealing resin layer 15, but an upper end thereof is exposed from the sealing resin layer 15. A barrier metal layer 17 is formed on the exposed upper end of each of the wiring posts 16. A bump ball 18 made of solder or the like is formed on the barrier metal layer 17.

In this type of semiconductor device having a CSP structure, wiring connecting semiconductor device elements to metal bumps is highly densely formed on a semiconductor substrate. Therefore, it is possible to reduce the size of the semiconductor device.

For further reduction of size or thickness of the semiconductor device, a thickness D of the semiconductor substrate needs to be reduced. Therefore, attempts to make the semiconductor device thinner by grinding the back face 11B have been made in semiconductor device packaging techniques.

However, thickness reduction of semiconductor substrates increases defects such as damage to or warpage of semiconductor substrates, and therefore lowers production yield of semiconductor devices. There have been some attempts to prevent defects due to thickness reduction of semiconductor substrates by forming a passivation film on a back face of a semiconductor substrate (see, for example, Japanese Patent Laid-Open Publications No. 2002-231854 and No. 2002-270720).

If, however, a passivation film is formed on a back face of a semiconductor substrate, the semiconductor device becomes thicker. Thus, thickness reduction of semiconductor devices remains difficult.

Another problem with forming a passivation film on a back face of a semiconductor substrate is that the passivation film is often partly separated from the semiconductor substrate in a process of forming a semiconductor device. Especially, a passivation film having properties (e.g. rigidity) different from those of a semiconductor substrate is often separated from the semiconductor substrate in a so-called dicing process where the semiconductor substrate is cut into chips. Such partial separation of the passivation film also lowers production yield of semiconductor devices.

SUMMARY OF THE INVENTION

It is a general object of the present invention to provide a novel and effective method of manufacturing a semiconductor device and a support structure for a semiconductor substrate to solve at least one problem described above.

A specific object of the present invention is to provide a method of manufacturing a semiconductor device and a support structure for a semiconductor substrate that reduce manufacturing defects of semiconductor devices with thin semiconductor substrates so as to manufacture thin semiconductor devices.

According to an aspect of the present invention, there is provided a method of manufacturing a semiconductor device that comprises a first step of grinding a second principle surface of a semiconductor substrate opposite to a first principle surface of the semiconductor substrate on which semiconductor device elements are formed, a second step of attaching a support structure configured to support the semiconductor substrate to the second principle surface after the first step, and a third step of detaching the semiconductor substrate from the support structure.

With this method of manufacturing a semiconductor device, thin semiconductor devices can be stably manufactured while preventing damage to semiconductor substrates.

It is preferable that the method of manufacturing a semiconductor device further comprise a dicing process of dicing the semiconductor substrate between the second step and the third step. With this method, thin semiconductor devices can be manufactured while preventing damage to semiconductor substrates in the dicing process.

It is also preferable that the method of manufacturing a semiconductor device further comprise a sealing process of covering the first principle surface with a resin layer between the second step and the third step. This method can prevent damage to semiconductor devices in the sealing process.

It is also preferable that the method of manufacturing a semiconductor device further comprise a wiring step of forming a wiring section on the first principle surface to be connected to the semiconductor device elements prior to the third step. With this method, higher density wiring can be formed.

It is also preferable that, in the method of manufacturing a semiconductor device, the support structure comprise an adhesive layer formed to contact the semiconductor substrate and a supporting layer to support the adhesive layer, the adhesive layer comprising a first adhesive layer to adhere to the semiconductor substrate, a second adhesive layer configured to adhere to the supporting layer and having an adhesive force greater than an adhesive force of the first adhesive layer, and a base layer interposed between the first adhesive layer and the second adhesive layer. With this method, it is possible to detach the semiconductor substrate from the adhesive layer and to detach the adhesive layer from the supporting layer.

According to another aspect of the present invention, there is provided a support structure for a semiconductor substrate, the support structure being adapted to adhere to the semiconductor substrate and comprising an adhesive layer formed to adhere to the semiconductor substrate, and a supporting layer to support the adhesive layer, wherein the adhesive layer comprises a first adhesive layer to adhere to the semiconductor substrate, a second adhesive layer configured to adhere to the supporting layer and having an adhesive force greater than an adhesive force of the first adhesive layer, and a base layer interposed between the first adhesive layer and the second adhesive layer.

This support structure can protect thin semiconductor substrates from damage and warpage while supporting the semiconductor substrates. Moreover, this support structure allows a semiconductor substrate to be detached from an adhesive layer and allows the adhesive layer to be detached from a supporting layer.

It is preferable that, in the support structure for a semiconductor substrate, the supporting layer include a Si wafer. If so, the supporting layer can be easily formed.

According to these aspects of the present invention, it is possible to reduce manufacturing defects of semiconductor devices with thin semiconductor substrates so as to manufacture thin semiconductor devices.

DETAILED DESCRIPTION OF THE PREFERRED EMBODIMENT

The following description provides exemplary embodiments of the present invention with reference to the accompanying drawings.

First Embodiment

Figure 2:
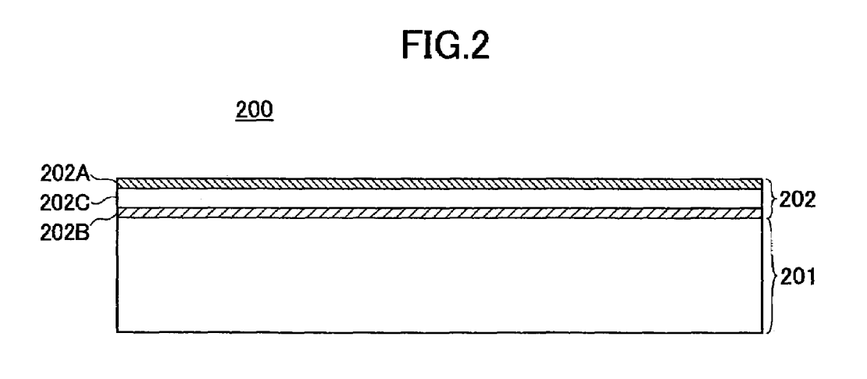
FIG. 2 is a schematic cross-sectional view of a support structure according to a first embodiment.

FIG. 2 is a schematic cross-sectional view of a support structure 200 for a semiconductor substrate according to a first embodiment.

Referring to FIG. 2, the support structure 200 of this embodiment is a type adapted to adhere to a semiconductor substrate, comprising an adhesive layer 202 formed to adhere to a semiconductor substrate and a supporting layer 201 configured to support the adhesive layer 202. The adhesive layer 202 includes a first adhesive layer 202A that adherers to the semiconductor substrate and a second adhesive layer 202B that has a greater adhesive force than the first adhesive layer 202A and adheres to the supporting layer 201.

A base layer 202C made of PET (polyethylene terephthalate), PEN. (polyethylene naphthalate) or the like is interposed between the first adhesive layer 202A and the second adhesive layer 202B.

When the support structure 200 of this embodiment is attached to a back face of a semiconductor substrate, the first adhesive layer 202A adheres to the back face of the semiconductor substrate.

In typical semiconductor device manufacturing processes, semiconductor substrates go through a so-called backgrinding process, where back faces of the semiconductor substrates are ground to reduce the thickness thereof. However, the semiconductor substrates having thickness thus reduced are likely to suffer warpage or damage. Such warpage and damage of semiconductor substrates can be prevented by attaching the support structure 200 of this embodiment to the back faces of the semiconductor substrates after reducing the thickness of the semiconductor substrates in the backgrinding process.

The adhesive force of the first adhesive layer 202A is adjusted to allow the semiconductor substrate attached to the first adhesive layer 202A to be detached from the support structure 200.

Therefore, unlike conventional techniques, a passivation layer (or the supporting layer) of the semiconductor substrate does not remain on the back face of the finished semiconductor device. Thus, semiconductor substrates can be protected from warpage and damage in semiconductor device manufacturing processes such as a packaging process, while the thickness of the semiconductor devices is reduced.

As mentioned previously, the adhesive force of the second adhesive layer 202B is greater than the adhesive force of the first adhesive layer 202A. Therefore, when the semiconductor substrate is detached from the support structure 200, the adhesive layer 202 remains on the supporting layer 201 without being detached (separated) from the supporting layer 201.

On the other hand, the adhesive layer 202 including the first adhesive layer 202A and the second adhesive layer 202B can be detached (separated) from the supporting layer 201 with a force greater than a force required for detaching the semiconductor substrate. More specifically, the adhesive layer 202 is separated from the supporting layer 201 at the interface between the second adhesive layer 202B and the supporting layer 201.

This configuration allows the separated adhesive layer 202 and the supporting layer 201 to be reused individually. For example, if an impact is applied to the support structure 200 and therefore the supporting layer 201 is damaged, the adhesive layer 202 may be separated from the damaged supporting layer 201 to be reused with a new supporting layer 201. If, on the other hand, the adhesive layer 202 is damaged or becomes unusable due to loss of adhesive force, the supporting layer 201 may be separated from the damaged or unusable adhesive layer 202 to be reused with a new adhesive layer 202.

The adhesive layer 202 is preferably formed such that the first adhesive layer 202A and the second adhesive layer 202B are attached one on each side of the base layer 202C made of PET, PEN or the like. In this way, the adhesive layer 202 can be easily formed to have the upper face and the lower face with different adhesive forces and to be attachable to both the semiconductor substrate and the supporting layer 201.

The supporting layer 201 preferably has a predetermined rigidity to support the semiconductor substrate and to protect the semiconductor substrate from damage and warpage.

It is preferable to have heat resistance and chemical resistance to prevent damage, corrosion and etching in various processes performed in the semiconductor device manufacturing processes (packaging process). It is also preferable to have physical properties, such as the thermal expansion coefficient, that are the same as or similar to physical properties of the semiconductor substrate.

The supporting layer 201 is preferably formed of a Si wafer to meet the requirements described above. Particularly in the case where the semiconductor substrate supported by the support structure 200 is formed of a Si wafer, it is advantageous in that there is no need to process the support structure because the support structure 200 and the supported semiconductor substrate substantially have the same size and materials, as well as in that they are readily available. Moreover, costs can be lowered by using so-called reclaimed Si wafers, which are formed by etching or grinding faces on which semiconductor device elements and films are formed previously, as the supporting layer 201.

It should be understood that glass plates or ceramic plates are applicable as the supporting layer 201 if the above requirements are satisfied.

The following describes a method of manufacturing a semiconductor device using the support structure of this embodiment.

Second Embodiment

Figure 3A:
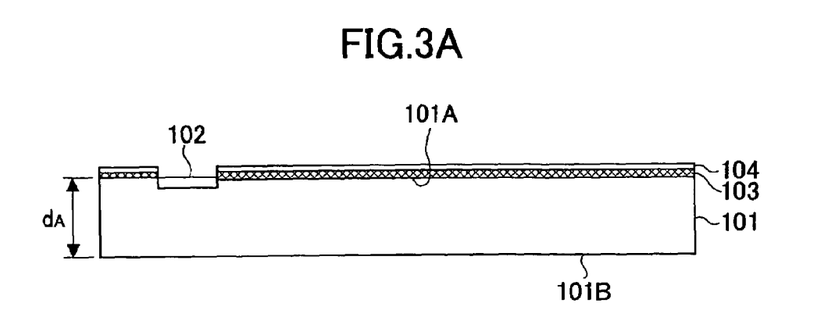
FIGS. 3A through 3P illustrate the method of manufacturing a semiconductor device according to a second embodiment.
Figure 3B:
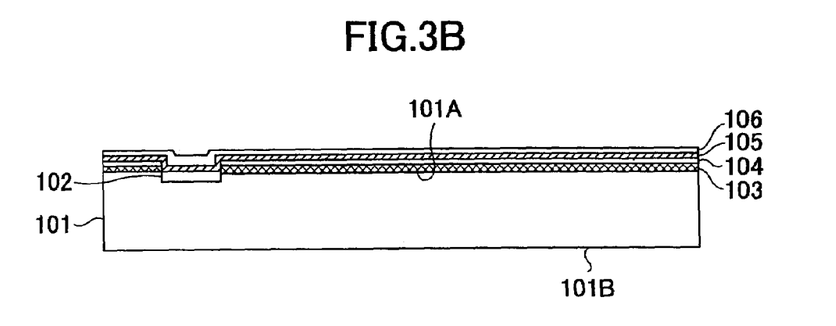
Figure 3C:
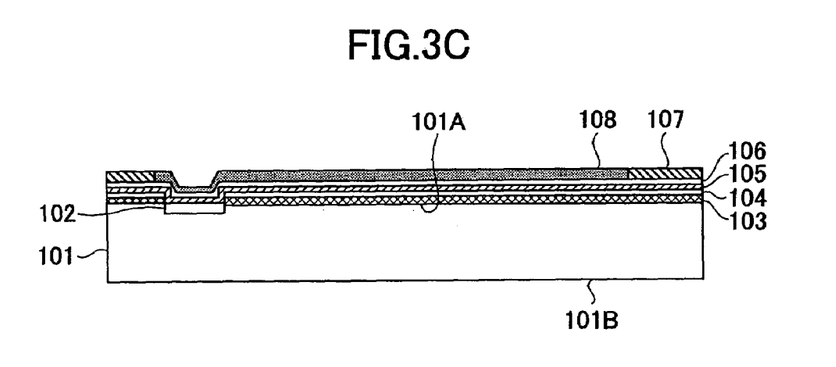
Figure 3D:
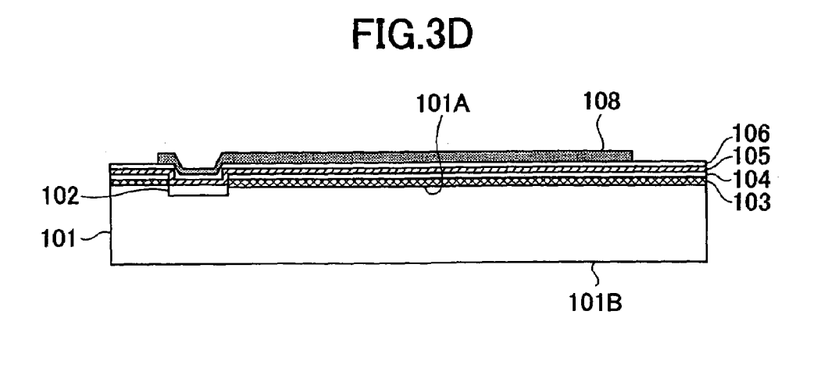
Figure 3E:
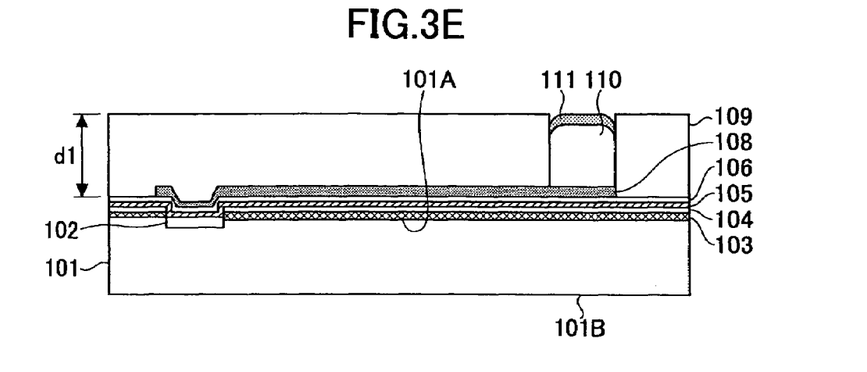
Figure 3F:
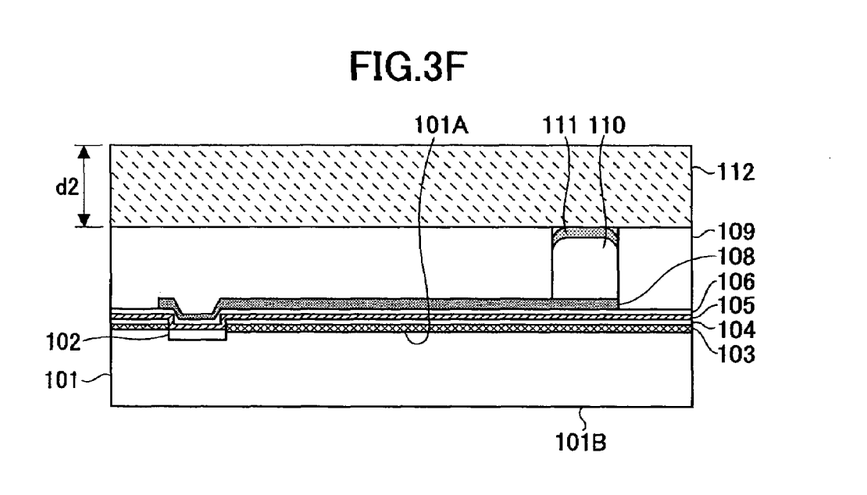
Figure 3G:
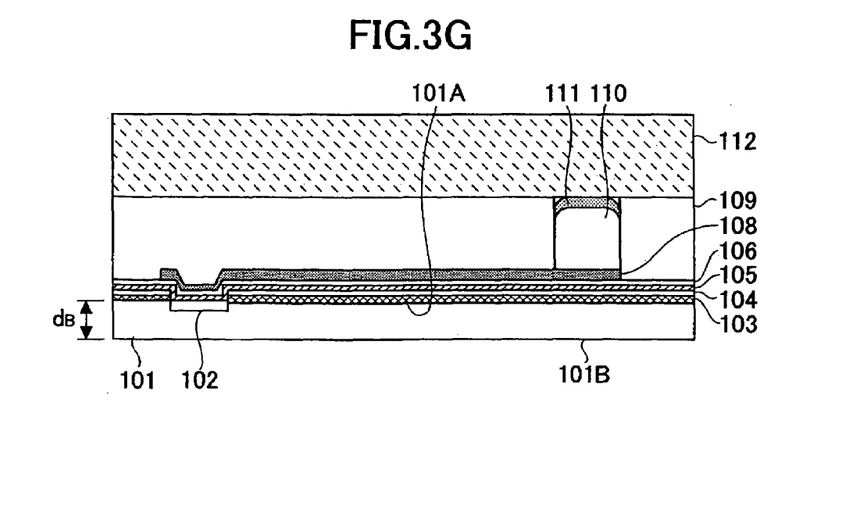
Figure 3H:
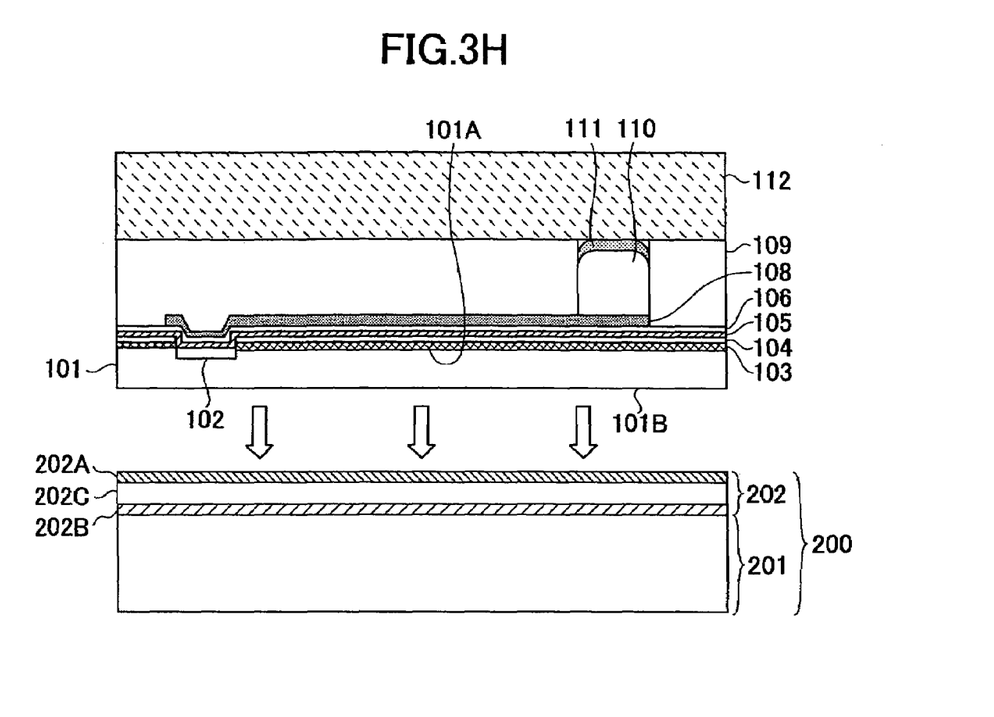
Figure 3I:
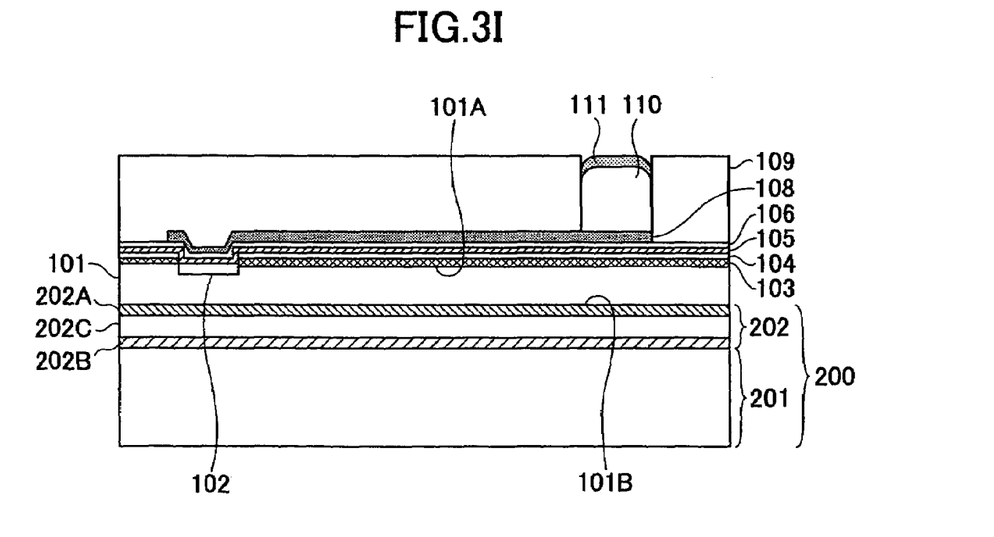
Figure 3J:
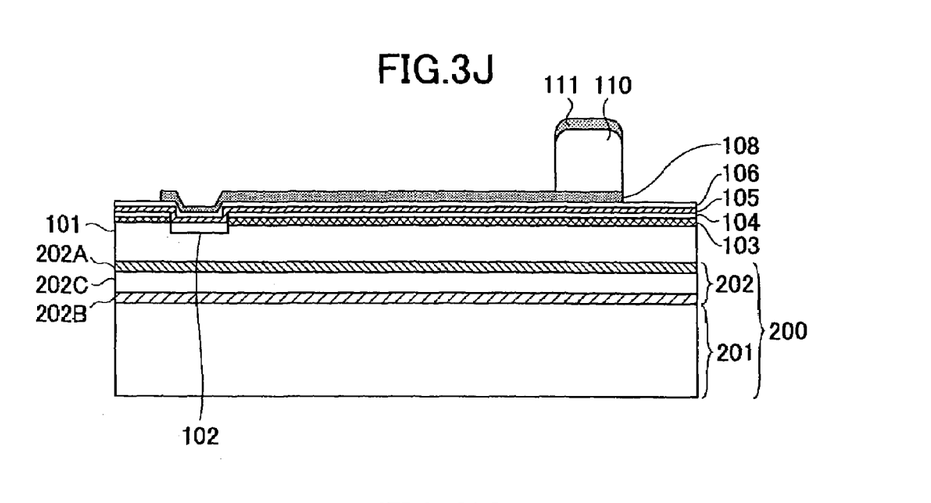
Figure 3K:
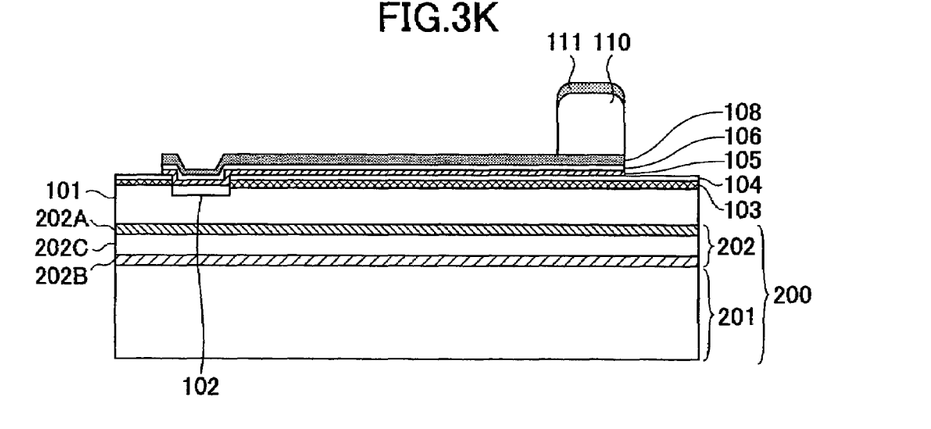
Figure 3L:
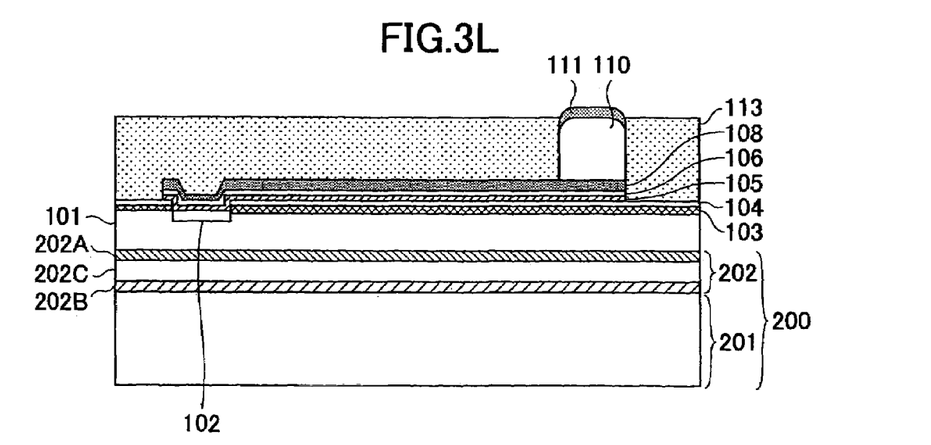
Figure 3M:
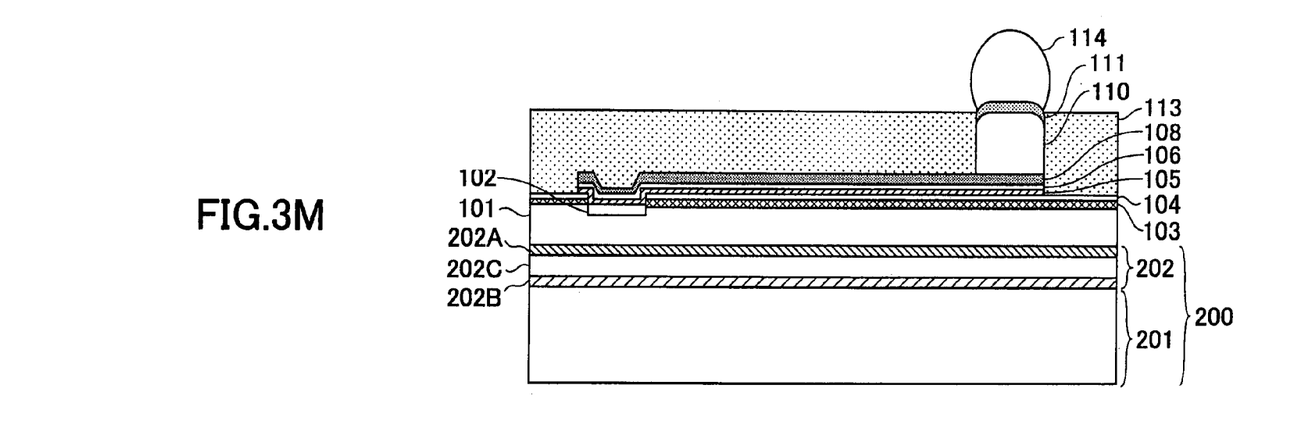
Figure 3N:
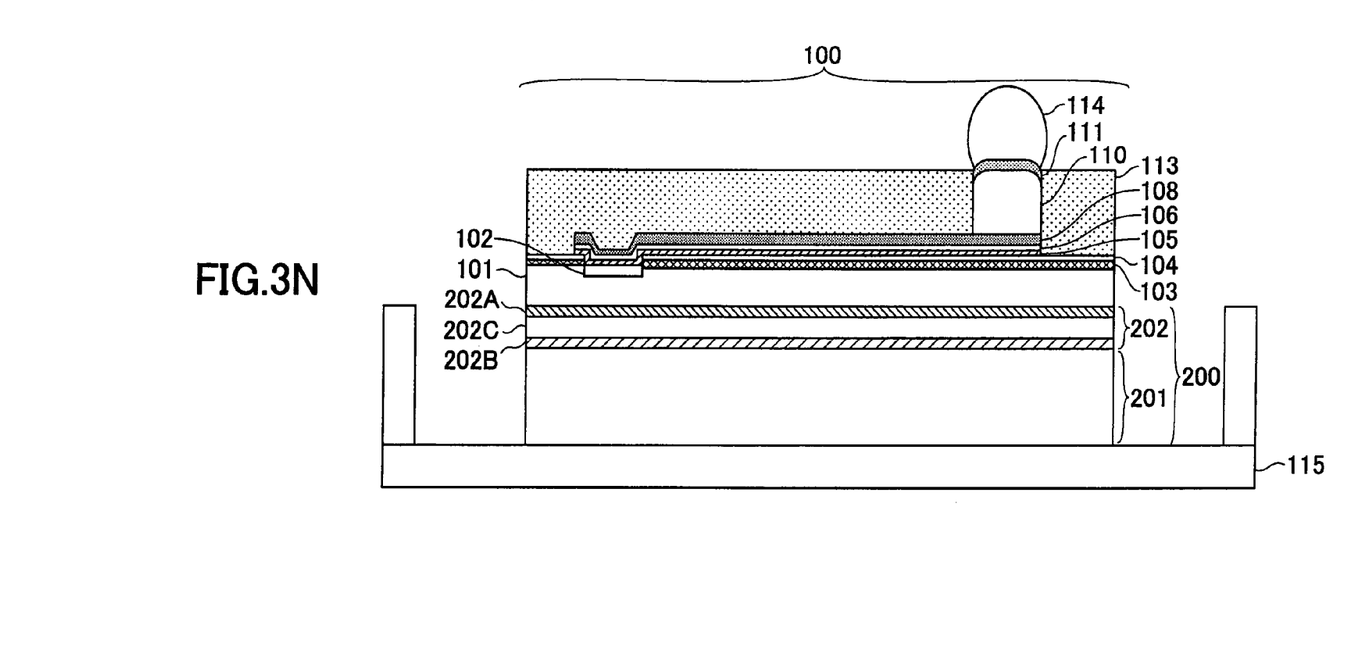
Figure 3O:
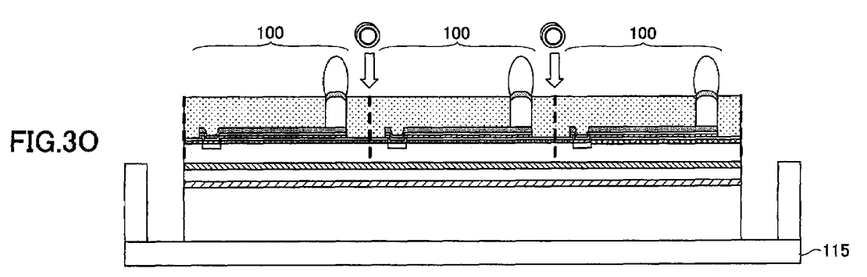
Figure 3P:
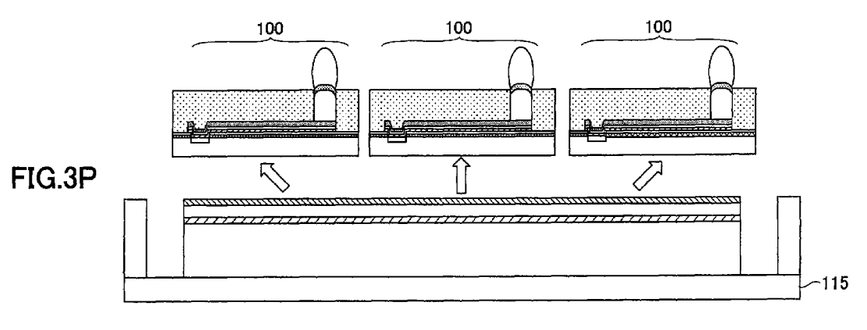

FIGS. 3A through 3P illustrate the method of manufacturing a semiconductor device step by step according to a second embodiment.

First, in a process shown in FIG. 3A, a substrate 101 on which semiconductor device elements are formed is prepared. For instance, the substrate 101 formed of a semiconductor substrate such as a Si wafer has a device face 101A on which semiconductor device elements are formed. There is also formed an electrode pad 102 made of Al or the like to be connected to a part of the device. The distance between the device face 101A of the substrate 101 and a back face 101B opposite to the device face 101A, i.e., a thickness dA of the substrate 101 is approximately 700 μm, although not limited to this thickness.

A passivation layer 103 made of SiN or the like is formed to cover the device face 101A while leaving the electrode pad 102 exposed through an opening. A passivation layer 104 made of polyimide or the like is formed on the passivation layer 103 while also leaving the electrode pad 102 exposed through an opening.

Then in a process shown in FIG. 3B, a metal adhesion layer 105 made of metal such as Cr and Ti is formed on the electrode pad 102 and the passivation layer 104 by sputtering. Further, a seed layer 106 made of Cu is formed on the adhesion layer 105 by sputtering.

Then in a process shown in FIG. 3C, a photoresist layer 107 is formed. A mask (not shown) is then formed on the photoresist layer 107, and the photoresist is patterned by exposure and development.

A wiring section 108 electrically connected to the electrode pad 102 is formed where the photoresist is removed on the patterning. The wiring section 108 is formed by Cu electrolytic plating using the seed layer 106 as a power supply layer.

Then in a process shown in FIG. 3D, photoresist is removed by organic solvent or the like.

Then in a process shown in FIG. 3E, a photoresist layer 109 made of a photosensitive dry film or the like is attached to cover the wiring section 108 and the seed layer 106. The photoresist layer 109 is patterned by exposure and development using a mask. A wiring post 110 is formed upright on the wiring section 108 on which the photoresist is removed. The wiring post 110 is formed by Cu electrolytic plating using the seed layer 106 as a power supply layer.

A plating layer 111 having, for example, a Ni/Pd/Au structure is then formed on the wiring post 110 by electrolytic plating. The plating layer 111 serves as a barrier (or serves to prevent diffusion) while improving adhesiveness. Preferably, an upper end face of the plating layer 111 is substantially flush with an upper end face of the photoresist layer 109.

A thickness d1 of the photoresist layer 109 is, for example, 100 μm, although not limited to this thickness.

Then in a process shown in FIG. 3F, a backgrinding tape 112 made of resin or the like is attached on the photoresist layer 109 and the plating layer 111. The backgrinding tape 112 has a thickness d2 of, for example, 150 μm. The backgrinding tape 112 serves as a passivation layer for the device face 101A, the wiring post 110, the plating layer 111 and the wiring section 108 in the following process of grinding the back face 101B of the substrate 101, and also makes it easy to hold (chuck) the substrate 101 in a grinding machine (not shown).

Then in a process shown in FIG. 3G, the back face 101B of the substrate 101 is ground by the grinding machine so as to reduce the thickness of the substrate 101 to a thickness dB. The thickness is, for example, around 200 μm through 300 μm, although not limited to this thickness.

Then in a process shown in FIG. 3H, the substrate 101 is attached to the support structure 200 of FIG. 2. In FIG. 3H, elements identical to those already described bear the same reference numbers and are not further discussed.

The support structure 200 as shown in FIG. 2 comprises the supporting layer 201 and the adhesive layer 202 formed thereon. The adhesive layer 202 includes the base layer 202C, and the first adhesive layer 202A and the second adhesive layer 202B attached on the upper face and the lower face, respectively, of the base layer 202C.

In this process shown in FIG. 3H, the back face 101B of the ground substrate 101 is attached to the first adhesive layer 202A of the support structure 200. The adhesive force of the first adhesive layer 202A is adjusted to be smaller than the adhesive force of the second adhesive layer 202B. Therefore, the substrate 101 can be easily detached from the adhesive layer 202 in the following process while preventing the adhesive layer 202 from being detached from the supporting layer 201.

The supporting layer 201 prevents warpage of the substrate 101 in this and following processes and also prevents damage to the substrate 101 to improve the production yield of the semiconductor device.

In the case where the supporting layer 201 is formed of a Si wafer, the supporting layer 201 and the substrate 101 have the same physical properties including thermal expansion coefficient. Therefore, the supporting layer 201 expands and deforms to follow expansion and deformation of the substrate 101, and thus prevents cracking of the substrate 101.

A method of protecting or holding a semiconductor substrate with a back face thereof attached to a supporting structure as described in this process is especially effective in a semiconductor device manufacturing process including a backgrinding process for reducing the thickness of the substrate. Also, this method is suitable to meet the recent demands for higher performance and smaller semiconductor devices.

As the support structure 200 described in this embodiment is attached to the substrate 101 by the first adhesive layer 202A, the support structure 200 can be detached from the substrate 101. Therefore, unlike a conventional passivation film formed, for example, on a back face of a substrate and which cannot be easily detached therefrom, the support structure 200 makes it possible to have thinner semiconductor devices with no increase in thickness.

Then in a process in FIG. 3I, the backgrinding tape 112 is removed. Then in a process shown in FIG. 3J, the photoresist layer 109 is separated.

Then in a process shown in FIG. 3K, the exposed part of the seed layer 106 is removed by wet etching, and then the part of the adhesion layer 105 exposed by wet etching is also removed by wet etching. Thus, the seed layer 106 and the adhesion layer 105 not covered by the wiring section 108 are removed by etching.

Then in a process shown in FIG. 3L, a molded resin layer 113 is formed to cover the passivation layer 104, the wiring section 108 and a side wall of the wiring post 110, and the molded resin is then heated and cured. It should be noted that an upper end of the plating layer 111 is exposed on the molded resin for electrical connection.

The resin layer 113 may alternatively be formed by lamination of resin films.

Then in a process shown in FIG. 3M, a solder bump 114 electrically connected to the wiring post 110 through the plating layer 111 is formed on the plating layer 111.

Then in a process shown in FIG. 3N, the support structure 200 with the substrate 101 attached thereon is attached on a dicing tape 115 having a dicing frame to be prepared for the following dicing process. In this process shown in FIG. 3N, production of a semiconductor device (semiconductor chip) is completed except the dicing process, i.e., a process of cutting the substrate 101 into chips. That is, there is obtained a semiconductor device (semiconductor chip) 100 that has the substrate 101, the device face 101A, the electrode pad 102, the passivation layer 103, the adhesion layer 105, the seed layer 106, the wiring section 108, the wiring post 110, the plating layer 111, the molded resin layer 113 and the solder bump 114. Although FIG. 3N shows only one semiconductor device 100, there are plural semiconductor devices 100 formed in an array along a plane in a direction that the substrate 101 extends.

Then in a process shown in FIG. 3O, the substrate 101 is cut by a dicing technique to have the plural semiconductor devices 100 separated from each other. The dicing machine is preferably controlled such that only the molded resin layer 113 through the substrate 101 are cut but not the support structure 200.

Then in a process shown in FIG. 3P, the semiconductor devices (semiconductor chips) 100 separated from each other by the dicing technique are detached from the support structure 200 by separating the back face 101B of each of the semiconductor devices 100 from the first adhesive layer 202A using a dicing picker or the like, and thus the completed semiconductor devices 100 are obtained.

In this way, the substrate 101 is easily detached from the support structure 200, thereby preventing increase of thickness of the semiconductor device 100 due to the use of the support structure 200. The thickness of the semiconductor device 100 can be thus reduced. In conventional cases where a substrate and a passivation film attached on a back face of the substrate are diced together in a dicing process, defects such as partial separation or loss of the passivation film and chipping often occur. Such partial separation or loss of the passivation film, for instance, leads to variation of thickness and shape of semiconductor devices. This embodiment can prevent these problems and therefore enable stably manufacturing semiconductor devices having the same shape, that is, offers reproducibility of shape.

In this embodiment, in the processes after the support structure 200 is attached to the substrate 101, cracking and warpage of the substrate 101 are prevented because the substrate 101 is supported or held by the support structure 200.

For example, the support structure 200 serves to prevent cracking and warpage of the substrate 101 in the process of removing the backgrinding tape 112 shown in FIG. 3I, the process of separating the photoresist layer 109 shown in FIG. 3J, the process of etching the seed layer 106 and the adhesion layer 105 shown in FIG. 3K, and the process of forming the solder bump 114 shown in FIG. 3M.

Especially, in the process of forming the molded resin shown in FIG. 3L, it is possible to prevent damage to the substrate 101 due to a reaction force which might be applied to the layers including the molded resin formed on the substrate 101 while the molded resin is cured by heating.

Moreover, in the dicing process shown in FIG. 3O, dicing operations are stably performed while preventing defects such as damage to and chipping in the substrate 101.

In the step of separating the semiconductor device 100 from the support structure 200, the semiconductor device 100 can be separated from the adhesive layer 202 without separating the adhesive layer 202 from the supporting layer 201, because the adhesive force of the first adhesive layer 202A is smaller than the adhesive force of the second adhesive layer 202B.

The adhesive layer 202 including the first adhesive layer 202A and the second adhesive layer 202B can be detached (separated) from the supporting layer 201 with a force greater than a force required for detaching the substrate 101. More specifically, the adhesive layer 202 is separated from the supporting layer 201 at the interface between the second adhesive layer 202B and the supporting layer 201. This configuration allows the separated adhesive layer 202 and the supporting layer 201 to be reused individually.

As the support structure 200 of this embodiment can be reused, costs required for protection of the substrate 101 can be reduced. Furthermore, the supporting layer 201 and the adhesive layer 202 are independently reusable, and therefore maintenance cost is also reduced.

Although above embodiments exemplify the method of manufacturing a semiconductor device having a CSP structure, it should be understood that the present invention is not limited thereto. The present invention is applicable to other methods of manufacturing a semiconductor device having a so-called backgrinding process of grinding a back face of a semiconductor substrate to reduce the thickness of the semiconductor substrate. If the present invention is applied to these methods, the methods make it possible to improve production yield of semiconductor devices by preventing cracking and warpage of substrates, and allow a substrate to be detached from a support structure and therefore enable reduction of thickness of semiconductor devices as with the method of manufacturing a semiconductor device having a CSP structure.

While the present invention has been described in terms of preferred embodiments, it will be apparent to those skilled in the art that variations and modifications may be made without departing from the scope of the invention as set forth in the accompanying claims.

The present application is based on Japanese Priority Application No. 2004-159871 filed on May 28, 2004, with the Japanese Patent Office, the entire contents of which are hereby incorporated by reference.

What is claimed is:

1. A method of manufacturing a semiconductor device having first and second principle surfaces, the method comprising:

forming a metal adhesion layer on the first principle surface, then forming a photoresist layer thereon;

grinding the second principle surface of a semiconductor substrate opposite to the first principle surface of the semiconductor substrate on which semiconductor device elements are formed;

attaching a support structure configured to support the semiconductor substrate to the second principle surface after the grinding step;

removing the photoresist layer and forming a molded resin on the metal adhesion layer;

detaching the semiconductor substrate from the support structure;

wherein the support structure comprises:

an adhesive layer formed to contact with the semiconductor substrate; and a supporting layer to support the adhesive layer, the supporting layer being made from one of glass and ceramic;

the adhesive layer including a first adhesive layer to adhere to the semiconductor substrate;

a second adhesive layer to adhere to the supporting layer, having an adhesive force greater than an adhesive force of the first adhesive layer; and a base layer interposed between the first adhesive layer and the second adhesive layer, said second adhesive layer capable of adhering to the support structure and capable of being removed from the support structure.

2. The method of manufacturing a semiconductor device as claimed in claim 1, further comprising:

a dicing process of dicing the semiconductor substrate between the attaching step and the detaching step.

3. The method of manufacturing a semiconductor device as claimed in claim 1, further comprising:

a sealing process of covering the first principle surface with a resin layer between the attaching step and the detaching step.

4. The method of manufacturing a semiconductor device as claimed in claim 1, further comprising:

a wiring step of forming a wiring section on the first principle surface to be connected to the semiconductor device elements prior to the detaching step.

* * * * *